US008641851B2

(12) United States Patent
Lee et al.

(10) Patent No.: US 8,641,851 B2
(45) Date of Patent: Feb. 4, 2014

(54) APPARATUS AND METHOD FOR MANUFACTURING A FLEXIBLE DISPLAY DEVICE

(75) Inventors: NamSeok Lee, Seoul (KR); SoonSung Yoo, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 20 days.

(21) Appl. No.: 13/549,160

(22) Filed: Jul. 13, 2012

(65) Prior Publication Data

US 2013/0032282 A1 Feb. 7, 2013

(30) Foreign Application Priority Data

Aug. 2, 2011 (KR) .................. 10-2011-0076882

(51) Int. Cl.
| | |
|---|---|
| B29C 65/00 | (2006.01) |
| B32B 37/00 | (2006.01) |
| B32B 38/10 | (2006.01) |
| B32B 39/00 | (2006.01) |
| B32B 43/00 | (2006.01) |
| B65H 37/00 | (2006.01) |
| B29C 63/02 | (2006.01) |

(52) U.S. Cl.
USPC ........ 156/249; 156/235; 156/237; 156/272.8; 156/712; 156/540; 156/541; 156/552; 156/553; 156/555; 156/753

(58) Field of Classification Search
USPC ............... 156/230, 235, 237, 238, 247, 249, 156/272.2, 272.8, 701, 711, 712, 538, 540, 156/541, 552, 553, 555, 751, 752, 753
See application file for complete search history.

(56) References Cited

U.S. PATENT DOCUMENTS

| | | | | | |
|---|---|---|---|---|---|
| 5,465,263 | A | * | 11/1995 | Bour et al. ..................... | 372/23 |
| 5,580,410 | A | * | 12/1996 | Johnston ...................... | 156/240 |
| 5,806,181 | A | * | 9/1998 | Khandros et al. ............... | 29/874 |
| 5,974,662 | A | * | 11/1999 | Eldridge et al. ................ | 29/842 |
| 6,139,402 | A | * | 10/2000 | Moore ........................... | 451/41 |
| 6,296,735 | B1 | * | 10/2001 | Marxer et al. ............ | 156/345.32 |
| 6,309,290 | B1 | * | 10/2001 | Wang et al. ................... | 451/398 |
| 6,358,129 | B2 | * | 3/2002 | Dow ............................ | 451/285 |
| 6,439,822 | B1 | * | 8/2002 | Kimura et al. ........... | 414/331.04 |
| 6,460,369 | B2 | * | 10/2002 | Hosokawa ..................... | 62/378 |
| 6,543,286 | B2 | * | 4/2003 | Garverick et al. .......... | 73/514.18 |
| 6,615,485 | B2 | * | 9/2003 | Eldridge et al. ................ | 29/843 |
| 6,767,439 | B2 | * | 7/2004 | Park ........................ | 204/298.25 |
| 6,875,497 | B2 | * | 4/2005 | Emery et al. ................ | 428/195.1 |
| 7,012,746 | B2 | * | 3/2006 | Bermel ..................... | 359/485.03 |
| 7,086,149 | B2 | * | 8/2006 | Eldridge et al. ................ | 29/876 |
| 7,110,157 | B2 | * | 9/2006 | Beteille et al. ................ | 359/265 |
| 7,140,883 | B2 | * | 11/2006 | Khandros et al. ............... | 439/66 |
| 7,338,983 | B2 | * | 3/2008 | Simpson et al. .............. | 521/170 |
| 7,347,702 | B2 | * | 3/2008 | Eldridge et al. ................ | 439/81 |

(Continued)

Primary Examiner — Sing P Chan
(74) Attorney, Agent, or Firm — Birch, Stewart, Kolasch & Birch, LLP

(57) ABSTRACT

An apparatus and method for manufacturing a flexible display device by a roll-to-roll method, are discussed. According to an embodiment, the apparatus includes a substrate transferring part for transferring a lower substrate attached onto a carrier substrate; a substrate separating part for separating the carrier substrate from the lower substrate transferred by the substrate transferring part; an upper bonding part for bonding an upper substrate to an upper surface of the lower substrate from which the carrier substrate is separated; and a lower bonding part for bonding a rear substrate to a lower surface of the lower substrate from which the carrier substrate is separated.

12 Claims, 2 Drawing Sheets

(56) References Cited

U.S. PATENT DOCUMENTS

| | | | |
|---|---|---|---|
| 7,522,323 B2 * | 4/2009 | Clube | 359/17 |
| 7,557,381 B2 * | 7/2009 | Eisert et al. | 257/81 |
| 7,675,625 B2 * | 3/2010 | Yoon | 356/445 |
| 7,736,995 B2 * | 6/2010 | Vos | 438/458 |
| 7,875,138 B2 * | 1/2011 | Yamada et al. | 156/64 |
| 7,894,119 B2 * | 2/2011 | Valentin et al. | 359/275 |
| 7,942,619 B2 * | 5/2011 | Hashimoto et al. | 414/217 |
| 7,944,429 B2 * | 5/2011 | Kang et al. | 345/102 |
| 8,009,265 B2 * | 8/2011 | Kim | 349/187 |
| 8,034,206 B2 * | 10/2011 | Kim et al. | 156/235 |
| 8,182,633 B2 * | 5/2012 | Yoon et al. | 156/247 |
| 8,313,605 B2 * | 11/2012 | Yamamoto et al. | 156/248 |
| 2005/0016670 A1 * | 1/2005 | Kanbara et al. | 156/257 |
| 2009/0130607 A1 * | 5/2009 | Slafer | 430/323 |
| 2010/0300611 A1 * | 12/2010 | Yamamoto et al. | 156/248 |
| 2012/0148781 A1 * | 6/2012 | Yamamoto et al. | 428/41.8 |

* cited by examiner

APPARATUS AND METHOD FOR MANUFACTURING A FLEXIBLE DISPLAY DEVICE

CROSS REFERENCE TO RELATED APPLICATIONS

This application claims the priority benefit of the Korean Patent Application No. 10-2011-0076882 filed on Aug. 2, 2011, which is hereby incorporated by reference as if fully set forth herein.

BACKGROUND OF THE INVENTION

1. Field of the Invention

The present invention relates to a flexible display device, and more particularly, to an apparatus and method for manufacturing a flexible display device by a roll-to-roll method.

2. Discussion of the Related Art

A flexible display device is a rollable or windable device, which is paperlike, whereby the flexible display device enables easy keeping and good portability. Owing to these advantages, the flexible display device has been steadily studied and developed as a next-generation display device.

The flexible display device may be manufactured by a roll-to-roll method, to thereby improve the yield.

The roll-to-roll method forms various device layers on a flexible substrate during supplying the flexible substrate by the use of supply roll and collecting the flexible substrate by the use of collection roll. These processes are performed consecutively. Thus, in comparison with a related art batch-type method, the roll-to-roll method realizes higher efficiency (higher yield).

However, if applying the roll-to-roll method, the flexible substrate may be deformed due to various reasons while passing through plural rolls. In this respect, there is a limitation on application of the roll-to-roll method to the flexible display device.

In order to solve the above problem relating the deformation of the substrate and improve convenience in substrate-transferring, there is proposed a method in which the process is performed under the condition that the flexible substrate is attached to an additionally-provided carrier substrate such as a glass substrate, and the carrier substrate is separated from the flexible substrate after completion of the process.

Up to now, however, it has not been applied to the roll-to-roll method, which causes lowering of efficiency.

SUMMARY OF THE INVENTION

Accordingly, the present invention is directed to an apparatus and method for manufacturing a flexible display device that substantially obviates one or more problems due to limitations and disadvantages of the related art.

An aspect of the present invention is to provide an apparatus and method for manufacturing a flexible display device, which facilitates to improve the yield by performing a process under the condition that a flexible substrate is attached to a carrier substrate, and performing a following bonding process by a roll-to-roll method.

To achieve these and other advantages and in accordance with the purpose of the invention, as embodied and broadly described herein, there is provided an apparatus for manufacturing a flexible display device comprising: a substrate transferring part for transferring a lower substrate attached onto a carrier substrate; a substrate separating part for separating the carrier substrate from the lower substrate transferred by the substrate transferring part; an upper bonding part for bonding an upper substrate to an upper surface of the lower substrate from which the carrier substrate is separated; and a lower bonding part for bonding a rear substrate to a lower surface of the lower substrate from which the carrier substrate is separated.

In another aspect of the present invention, there is provided an apparatus for manufacturing a flexible display device comprising: a substrate transferring part for transferring a lower substrate attached onto a carrier substrate; a substrate separating part for separating the carrier substrate from the lower substrate transferred by the substrate transferring part; an upper pattern part for forming a pattern material on an upper surface of the lower substrate from which the carrier substrate is separated; and a lower bonding part for bonding a rear substrate to a lower surface of the lower substrate from which the carrier substrate is separated.

In another aspect of the present invention, there is provided a method for manufacturing a flexible display device comprising: attaching a lower substrate onto a carrier substrate, and forming a predetermined device layer on the lower substrate; transferring the lower substrate attached onto the carrier substrate to a substrate separating part by the use of substrate transferring part; separating the carrier substrate from the lower substrate by the use of substrate separating part; bonding an upper substrate to an upper surface of the lower substrate, from which the carrier substrate is separated, by the use of upper bonding part, or forming a pattern material; and bonding a rear substrate to a lower surface of the lower substrate, from which the carrier substrate is separated, by the use of lower bonding part.

In another aspect of the present invention, there is provided a method for manufacturing a flexible display device comprising: attaching a lower substrate onto a carrier substrate, and forming a predetermined device layer on the lower substrate; transferring the lower substrate attached onto the carrier substrate to a substrate separating part by the use of substrate transferring part; separating the carrier substrate from the lower substrate by the use of substrate separating part; forming a pattern material on an upper surface of the lower substrate, from which the carrier substrate is separated, by the use of upper pattern part; and bonding a rear substrate to a lower surface of the lower substrate, from which the carrier substrate is separated, by the use of lower bonding part.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, an apparatus and method for manufacturing a flexible display device according to the present invention will be described with reference to the accompanying drawings.

Figure 1:
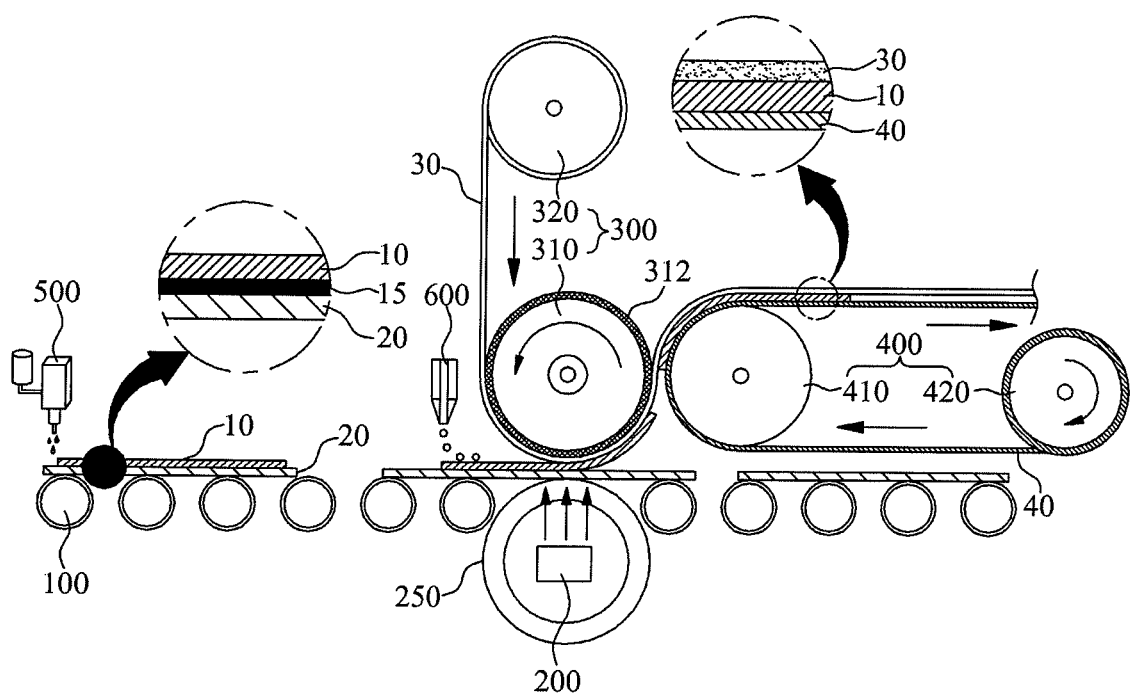
FIG. 1 illustrates an apparatus for manufacturing a flexible display device according to one embodiment of the present invention.

FIG. 1 illustrates an apparatus for manufacturing a flexible display device according to one embodiment of the present invention.

As shown in FIG. 1, the apparatus for manufacturing a flexible display device according to one embodiment of the present invention includes a substrate transferring part 100, a substrate separating part 200, an upper bonding part 300, and a lower bonding part 400.

The substrate transferring part 100 transfers a substrate. In more detail, the substrate transferring part 100 transfers a lower substrate 10 attached onto a carrier substrate 20, and transfers the carrier substrate 20 separated from the lower substrate 10. Thus, the carrier substrate 20 separated from the lower substrate 10 is transferred by the substrate transferring part 100, and is then loaded into a predetermined loading part, which enables to reuse the carrier substrate 20 with high efficiency.

The substrate transferring part 100 may be provided with a plurality of transfer rollers arranged at fixed intervals, but not necessarily.

In this case, the lower substrate 10 may be formed of a flexible substrate. The lower substrate 10 may be applied to a display device such as liquid crystal display device, organic light emitting device, or electrophoretic display device.

For example, if the lower substrate 10 is applied to the liquid crystal display device, a thin film transistor and pixel electrode may be formed on the lower substrate 10. If needed, a color filter may be additionally formed on the lower substrate 10. Also, if the lower substrate 10 is applied to the organic light emitting device, an organic light emitting layer may be formed on the lower substrate 10. If the lower substrate 10 is applied to the electrophoretic display device, a thin film transistor and pixel electrode may be formed on the lower substrate 10.

The carrier substrate 20 is attached to the flexible lower substrate 10, wherein the carrier substrate 20 prevents deformation of the lower substrate 10, and simultaneously facilitates to transfer the lower substrate 10. The carrier substrate 20 may be formed of a glass substrate. The carrier substrate 20 is attached to a lower surface of the lower substrate 10 by the use of adhesive 15.

The adhesive 15 makes the lower substrate 10 and carrier substrate 20 adhere to each other. For example, the adhesive 15 may include hydrogenated amorphous silicon (a-Si:H).

The substrate separating part 200 separates the carrier substrate 20 from the lower substrate 10 transferred by the substrate transferring part 100. The substrate separating part 200 may be formed of a laser irradiation device, but not necessarily.

When the carrier substrate 200 is irradiated with laser beam provided from the laser irradiation device, hydrogen ($H_2$) is produced from the hydrogenated amorphous silicon (a-Si:H) included in the adhesive 15, to thereby lower an adhesive strength between the carrier substrate 20 and the lower substrate 10. Thus, the carrier substrate 20 is separated from the lower substrate 10.

In order to make the laser beam irradiated onto a surface of the carrier substrate 20, which is not brought into contact with the lower substrate 10, for example, a lower surface of the carrier substrate 20, it is preferable that the substrate separating part 200 be positioned below the lower substrate 10 and carrier substrate 20. If the laser beam is irradiated toward the lower substrate 10, it might cause damages to the device formed on the lower substrate 10.

As shown in the drawings, the substrate separating part 200 may be positioned inside a support roll 250 provided under the lower substrate 10 and carrier substrate 20.

The support roll 250 confronts an upper bonding roll 310 of the upper bonding part 300. More particularly, the support roll 250 is positioned under the upper bonding roll 310 while confronting the upper bonding roll 310, so that it is possible to facilitate a bonding process in the upper bonding roll 310.

If the substrate separating part 200 is positioned inside the support roll 250, the support roll 250 is formed of a transparent material such as glass or quartz enabling the laser beam to pass therethrough.

The support roll 250 may rotate in an opposite direction to the upper bonding roll 310. In this case, the substrate may be transferred by the support roll 250 in corporation with the transfer roll of the substrate transferring part 100.

The upper bonding part 300 is provided to bond the upper substrate 30 to an upper surface of the lower substrate 10. The upper bonding part 300 may include the upper bonding roll 310 and an upper supply roll 320.

The upper bonding roll 310 is provided to bond the lower substrate 10 and upper substrate 30 to each other. For the smooth bonding process, the upper bonding roll 310 is positioned to confront the support roll 250, as mentioned above.

An cushion layer 312 may be additionally formed on the surface of the upper bonding roll 310. In this case, the bonding process of the upper bonding roll 310 may be smoothly performed owing to the additionally-provided cushion layer 312. The cushion layer 312 may be formed of sticky material.

The upper supply roll 320 is provided to supply the upper substrate 30 to the upper bonding roll 310. Thus, the upper substrate 30 is wound on the upper supply roll 320, and then the upper substrate 30 is supplied to the upper bonding roll 310 by rotation of the upper supply roll 320 and upper bonding roll 310.

However, it is not always necessary to supply the upper substrate 30 being wound on the upper supply roll 320. Instead, the upper substrate 30 may be manufactured by an additional processing line, and the manufactured upper substrate 30 may be consecutively supplied to the upper bonding roll 310. That is, if needed, it is possible to omit the upper supply roll 320.

In the same manner as the lower substrate 10, the upper substrate 30 may be formed of a flexible substrate. Also, a structure of the upper substrate 30 may vary according to a structure of the lower substrate 10. That is, the structure of the upper substrate 30 depends on the structure of the lower substrate 10, wherein the structure of the upper substrate 30 may be changeable according the mode of display device to be applied, for example, liquid crystal display device, organic light emitting device, or electrophoretic display device.

For example, if the aforementioned lower substrate 10 is applied to the liquid crystal display device, and the thin film transistor and pixel electrode are formed on the lower substrate 10, the color filter may be formed on the upper substrate 30. Meanwhile, if the aforementioned lower substrate 10 is applied to the liquid crystal display device, and the thin film transistor, pixel electrode, and color filter are formed on the lower substrate 10, only alignment layer may be formed on the upper substrate 30.

Also, if the aforementioned lower substrate 10 is applied to the organic light emitting device, the upper substrate 30 may be formed of a sealing film such as EVA film.

If the aforementioned lower substrate 10 is applied to the electrophoretic display device, the upper substrate 30 may be formed of an electrophoretic film including charge carrier and solvent.

Meanwhile, the function of the upper bonding part 300 is not limited to bonding the upper substrate 30 to the upper surface of the lower substrate 10. Furthermore, the upper bonding part 300 may be provided to form an additional pattern material on the lower substrate 10.

In this case, the upper bonding roll 310 included in the upper bonding part 300 may be provided with a patterned surface, for example, an uneven surface including protruding and hollow portions. The upper bonding roll 310 functions as a upper pattern part. After the protruding portion of the uneven surface of the upper bonding roll 310 is coated with a desired pattern material, the pattern material is printed onto the lower substrate 10, to thereby form a predetermined pattern material on the lower substrate 10. For example, the upper bonding roll 310 including the patterned surface may be applied to a process for manufacturing the electrophoretic display device, and more particularly, a process for forming a partition wall on the lower substrate 10 of the electrophoretic display device. The partition wall is provided to divide pixels, wherein color electrophoretic ink is disposed inside the partition wall, to thereby realize the color electrophoretic display device.

The lower bonding part 400 is provided to bond a rear substrate 40 to the lower surface of the lower substrate 10. The lower bonding part 400 may include a lower bonding roll 410 and a lower supply roll 420.

The lower bonding roll 410 is provided to bond the lower substrate 10 and the rear substrate 40 to each other. For the smooth bonding process, the lower bonding roll 410 is positioned to confront the upper bonding roll 310, as mentioned above. Although not shown, an cushion layer may be additionally provided on the surface of the lower bonding roll 410.

The lower supply roll 420 is provided to supply the rear substrate 40 to the lower bonding roll 410. Thus, the rear substrate 40 is wound on the lower supply roll 420, and then the rear substrate 40 is supplied to the lower bonding roll 410 by rotation of the lower supply roll 420 and lower bonding roll 410.

The rear substrate 40 may be formed of a flexible substrate, and the rear substrate 40 may function as a support substrate of flexible display device.

A bonding surface of the rear substrate 40, which is to be bonded to the lower substrate 10, may be coated with a predetermined adhesive. For this, a predetermined adhesive coating means may be additionally formed between the lower bonding roll 410 and the lower supply roll 420.

An apparatus for manufacturing the above flexible display device may further comprise additional structures according to the kind of display device to be manufactured.

For example, the apparatus for manufacturing the flexible display device may further comprise a sealant dispensing apparatus 500 and a liquid crystal dispensing apparatus 600.

The sealant dispensing apparatus 500 is provided to bond the lower substrate 10 and upper substrate 30 to each other, wherein the sealant dispensing apparatus 500 dispenses a predetermined sealant onto the margin of the lower substrate 10. A process for dispensing the sealant is carried out before bonding the lower substrate 10 and upper substrate 30 to each other. Preferably, the process for dispensing the sealant is carried out before separating the carrier substrate 20. In this respect, the sealant dispensing apparatus 50 is positioned in front of the upper bonding part 300, and is also positioned in front of the substrate separating part 200.

If the above flexible display device is the liquid crystal display device, the liquid crystal dispensing apparatus 600 is provided to dispense liquid crystal onto the lower substrate 10.

A process for dispensing liquid crystal is carried out before bonding the lower substrate 10 and upper substrate 30 to each other. Preferably, the process for dispensing liquid crystal is carried out before separating the carrier substrate 20. In this respect, the liquid crystal dispensing apparatus 600 is positioned in front of the upper bonding part 300, and is also positioned in front of the substrate separating part 200.

In the drawings, the liquid crystal dispensing apparatus 600 is positioned behind the sealant dispensing apparatus 500, but not necessarily. Alternatively, the sealant dispensing apparatus 500 may be positioned behind the liquid crystal dispensing apparatus 600.

Hereinafter, a method for manufacturing the flexible display device according to the embodiments of the present invention by the use of flexible display apparatus according to one embodiment of the present invention will be described with reference to FIGS. 1 and 2.

Figure 2:
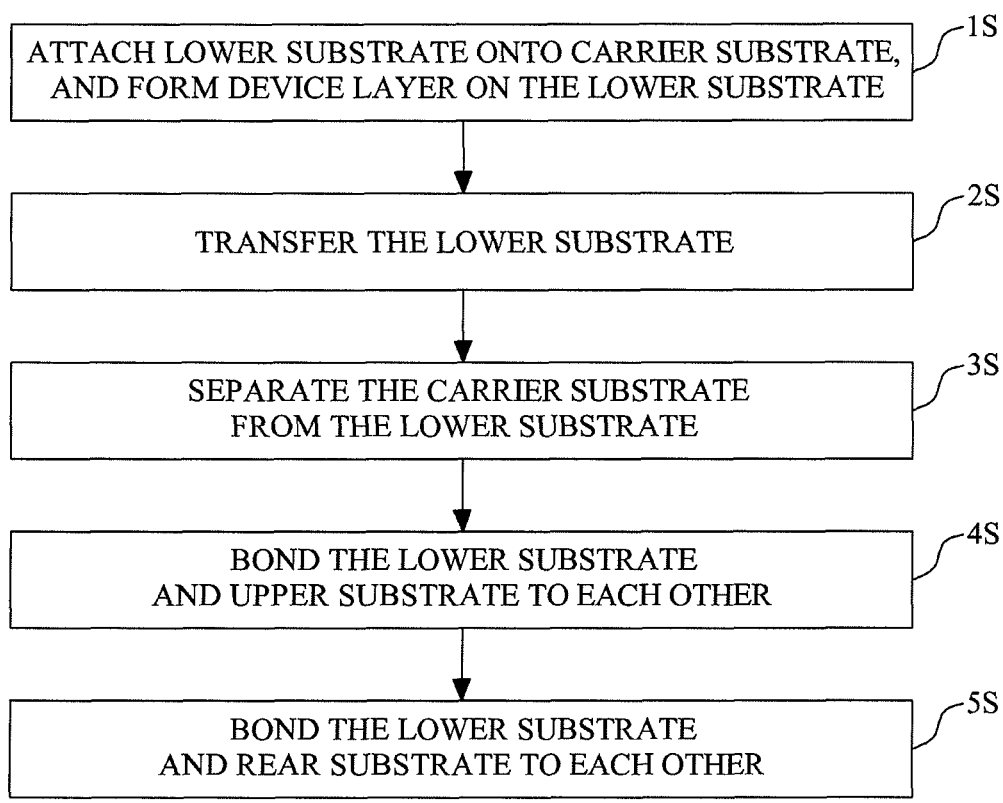
FIG. 2 is a flow chart showing a method for manufacturing a flexible display device according to one embodiment of the present invention.

FIG. 2 is a flow chart showing a method for manufacturing the flexible display device according to one embodiment of the present invention.

First, the lower substrate 10 is attached onto the carrier substrate 20 by the use of adhesive 15, and a predetermined device layer is formed on the lower substrate 10 (S1).

The carrier substrate 20 may be a glass substrate, and the adhesive 15 may include hydrogenated amorphous silicon (a-Si:H).

If the flexible display device is the liquid crystal display device, the device layer provided on the lower substrate 10 may include a thin film transistor, pixel electrode, and common electrode. In addition, the device layer provided on the lower substrate 10 may include a color filter and black column spacer.

If the flexible display device is the organic light emitting device, the device layer provided on the lower substrate 10 may include a thin film transistor, anode, organic light emitting layer, and cathode.

If the flexible display device is the electrophoretic display device, the device layer provided on the lower substrate 10 may include a thin film transistor and pixel electrode.

Then, the lower substrate 10 attached onto the carrier substrate 20 is transferred to the substrate separating part 200 by the use of substrate transferring part 100 (S2).

If the flexible display device is the liquid crystal display device, the sealant is dispensed on the lower substrate 10 by the use of sealant dispensing apparatus 500 during the above transferring process, and the liquid crystal is dispensed on the lower substrate 10 by the use of liquid crystal dispensing apparatus 600 during the above transferring process. In this case, this process is not necessarily limited to any particular order of carrying out the steps for dispensing the sealant and dispensing the liquid crystal.

If the flexible display device is the organic light emitting device or electrophoretic display device, the sealant may be dispensed on the lower substrate 10 by the use of sealant dispensing apparatus 500 during the above transferring process.

Then, the carrier substrate 20 is separated from the lower substrate 10 by the use of substrate separating part 200 (S3).

The above separating process may be carried out by irradiating the carrier substrate 20 with laser beam provided from the laser irradiation device arranged inside the support roll 250 under the lower substrate 10.

The carrier substrate 20 separated during the separating process may be transferred to the predetermined loading part by the use of substrate transferring part 100.

Then, the upper substrate 30 is bonded to the upper surface of the lower substrate 10 by the use of upper bonding part 300 (4S).

The process for bonding the lower substrate 10 and upper substrate 30 to each other may include steps for supplying the upper substrate 30 to the upper bonding roll 310, and making the supplied upper substrate 30 go through a space between the upper bonding roll 310 and the support roll 250. Thus, the upper substrate 30 is bonded to the upper surface of the lower substrate 10 passing over the support roll 250.

The process for supplying the upper substrate 30 to the upper bonding roll 310 may be carried out by unwinding the upper substrate 30 from the upper supply roll 320, or supplying the upper substrate 30 manufactured by the additional processing line to the upper bonding roll 310 consecutively.

If the flexible display device is the liquid crystal display device, the black matrix, color filter, and alignment layer may be formed on the upper substrate 30. In some cases, only alignment layer may be formed on the upper substrate 30.

If the flexible display device is the organic light emitting device, the upper substrate 30 may be formed of the sealing film such as EVA film.

If the flexible display device is the electrophoretic display device, the upper substrate 30 may be formed of the electrophoretic film including charge carrier and solvent.

Meanwhile, if the upper bonding roll 310 is provided with the patterned surface, the process for coating the predetermined pattern material is carried out instead of the process for bonding the upper substrate 30 to the upper surface of the lower substrate 10. This may be applied to the process for manufacturing the electrophoretic display device, and more particularly, the process for forming the partition wall for division of pixels on the lower substrate 10.

Then, the rear substrate 40 is bonded to the lower surface of the lower substrate 10 by the use of lower bonding part 400 (5S).

The process for bonding the lower substrate 10 and rear substrate 40 to each other may include steps for supplying the rear substrate 40 to the lower bonding roll 410, and making the supplied rear substrate 40 go through a space between the lower bonding roll 410 and the upper bonding roll 310. Thus, the rear substrate 40 is bonded to the lower surface of the lower substrate 10 passing over the upper bonding roll 310.

The process for supplying the rear substrate 40 to the lower bonding roll 410 may be carried out by unwinding the rear substrate 40 from the lower supply roll 420.

Accordingly, the processes for separating the carrier substrate 20 from the lower substrate 10, bonding the upper substrate 30 to the upper surface of the lower substrate 10, and bonding the rear substrate 40 to the lower surface of the lower substrate 10 are carried out by the roll-to-roll method, to thereby improve the yield.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An apparatus for manufacturing a flexible display device, the apparatus comprising:
    a substrate transferring part for transferring a lower substrate attached onto a carrier substrate;
    a substrate separating part for separating the carrier substrate from the lower substrate transferred by the substrate transferring part;
    an upper bonding part for bonding an upper substrate to an upper surface of the lower substrate from which the carrier substrate is separated; and
    a lower bonding part for bonding a rear substrate to a lower surface of the lower substrate from which the carrier substrate is separated.

2. The apparatus according to claim 1, wherein the substrate separating part is positioned inside a support roll provided under the lower substrate.

3. The apparatus according to claim 1, wherein the upper bonding part includes an upper bonding roll which confronts the support roll provided under the lower substrate.

4. The apparatus according to claim 1, wherein the lower bonding part includes a lower bonding roll, and a lower supply roll which supplies the rear substrate to the lower bonding roll.

5. The apparatus according to claim 1, wherein a sealant dispensing apparatus or liquid crystal dispensing apparatus is additionally provided in front of the upper bonding part.

6. An apparatus for manufacturing a flexible display device, the apparatus comprising:
    a substrate transferring part for transferring a lower substrate attached onto a carrier substrate;
    a substrate separating part for separating the carrier substrate from the lower substrate transferred by the substrate transferring part;
    an upper pattern part for forming a pattern material on an upper surface of the lower substrate from which the carrier substrate is separated; and
    a lower bonding part for bonding a rear substrate to a lower surface of the lower substrate from which the carrier substrate is separated.

7. The apparatus according to claim 6, wherein the upper part includes a roll provided with a patterned surface.

8. A method for manufacturing a flexible display device, the method comprising:
    attaching a lower substrate onto a carrier substrate, and forming a predetermined device layer on the lower substrate;
    transferring the lower substrate attached onto the carrier substrate to a substrate separating part by the use of substrate transferring part;
    separating the carrier substrate from the lower substrate by the use of substrate separating part;
    bonding an upper substrate to an upper surface of the lower substrate, from which the carrier substrate is separated, by the use of upper bonding part; and
    bonding a rear substrate to a lower surface of the lower substrate, from which the carrier substrate is separated, by the use of lower bonding part.

9. The method according to claim 8, wherein the process for separating the carrier substrate is carried out by irradiating the carrier substrate with laser beam provided from a laser irradiation device arranged inside the support roll under the lower substrate.

10. The method according to claim 8, wherein the process for bonding the upper substrate to the upper surface of the lower substrate is carried out by supplying the upper substrate to the upper bonding roll, and making the supplied upper substrate go through a space between the upper bonding roll and the support roll.

11. The method according to claim 8, wherein the process for bonding the rear substrate to the lower surface of the lower substrate is carried out by supplying the rear substrate to the lower bonding roll confronting the upper bonding roll, and making the supplied rear substrate go through a space between the upper bonding roll and the lower bonding roll.

12. A method for manufacturing a flexible display device, the method comprising:
   attaching a lower substrate onto a carrier substrate, and forming a predetermined device layer on the lower substrate;
   transferring the lower substrate attached onto the carrier substrate to a substrate separating part by the use of substrate transferring part;
   separating the carrier substrate from the lower substrate by the use of substrate separating part;
   forming a pattern material on an upper surface of the lower substrate, from which the carrier substrate is separated, by the use of upper pattern part; and
   bonding a rear substrate to a lower surface of the lower substrate, from which the carrier substrate is separated, by the use of lower bonding part.

* * * * *